United States Patent [19]
Sakamoto et al.

[11] 3,967,216
[45] June 29, 1976

[54] PULSE GENERATOR STABILIZED FOR CHANGE OF AMBIENT TEMPERATURE AND SOURCE VOLTAGE

[75] Inventors: Jyunji Sakamoto; Eisuke Shiratani; Norio Imaizumi, all of Gunma, Japan

[73] Assignees: Tokyo Sanyo Electric Company, Ltd.; Sanyo Electric Co., Ltd., Osaka, both of Japan

[22] Filed: Apr. 2, 1975

[21] Appl. No.: 564,635

[30] Foreign Application Priority Data
Apr. 3, 1974   Japan.............................. 49-38105

[52] U.S. Cl............................. 331/111; 331/108 D;
[51] Int. Cl.² .......................................... H03K 4/50
[58] Field of Search................. 331/111, 20, 108 D; 178/69.5 TV, 69.5 G

[56] References Cited
UNITED STATES PATENTS 3,351,871   11/1967   Swain................................ 331/111
3,680,003   7/1972   Walker ........................... 331/108 D

*Primary Examiner*—Siegfried H. Grimm
*Attorney, Agent, or Firm*—Armstrong, Nikaido & Wegner

[57] ABSTRACT

A pulse generator which can be applied to a horizontal deflection circuit and/or a vertical deflection circuit of a television set and of which almost all parts can be easily manufactured in a single IC (Integrated Circuit) chip has been found. A capacitor in an integrator circuit is charged and discharged alternately. The voltage across said capacitor and a second voltage, which is controlled by said voltage across said capacitor, are compared with a predetermined voltage. According to the result of the comparison, the capacitor is charged or discharged and, thus, a pulse oscillation is provided.

5 Claims, 11 Drawing Figures

PULSE GENERATOR STABILIZED FOR CHANGE OF AMBIENT TEMPERATURE AND SOURCE VOLTAGE

BACKGROUND OF THE INVENTION

The present invention relates to a pulse generator, in particular, relates to a voltage controlled pulse generator in a horizontal and/or vertical deflection circuit of a television set.

One prior pulse generator used in deflection circuits is a multivibrator having two capacitors. However, in order to manufacture the pulse generator in an IC chip, the number of external components outsides the IC chip should be as few as possible. Since the multivibrator type pulse generator must have two external capacitors, this prior pulse generator is not suitable for an IC chip.

To overcome the above problem, an IC type pulse generator, which uses only a single external capacitor has been produced. Some examples of this type of pulse generator are, TAA790 manufactured by ITT Semiconductors Company, XC1391P by Motorala Company and $\mu$PC570C by Nippon Electric Company. These pulse generators have an integrator circuit with a resistor and a capacitor, which is charged and discharged alternately. The voltage across said capacitor is compared with a reference voltage, and according to the result of the comparison, the capacitor is charged or discharged. Said reference voltage has two levels relating to the status of the circuit. However, the prior pulse generators including TAA790, XC1391P and $\mu$PC570C have the disadvantage that the pulse frequency is changed due to changes in the circumferential temperature and compensation of such frequency change is rather difficult.

SUMMARY OF THE INVENTION

It is an object, therefore, of the present invention to overcome the disadvantages and limitations of prior pulse generators by providing a new and improved pulse generator.

The above and other objects are attained by a pulse generator having: a capacitor, one end of which is grounded;
  a charge circuit connected between the other end of said capacitor and a power source;
  a discharge circuit connected between said other end of said capacitor and ground;
  a comparator having first, second and third transistors, the emitters of these transistors being commonly connected and grounded through a resistor, the base of the first transistor being connected to said other end of said capacitor, the base of the second transistor being connected to a constant reference voltage source, the base of the third transistor being connected to said other end of said capacitor through the resistor and an additional transistor, and said base of the third transistor being further connected to the voltage source through the resistor under the control of a switching transistor, and;
  a switching circuit for switching said charge circuit, said discharge circuit and said switching transistor according to the output of said comparator.

BRIEF DESCRIPTION OF THE DRAWINGS

The foregoing and other objects, features and attendant advantages of the invention will be appreciated as the same become better understood from the following description with reference to the accompanying drawings herein.

DESCRIPTION OF THE PREFERRED EMBODIMENTS

Figure 1:
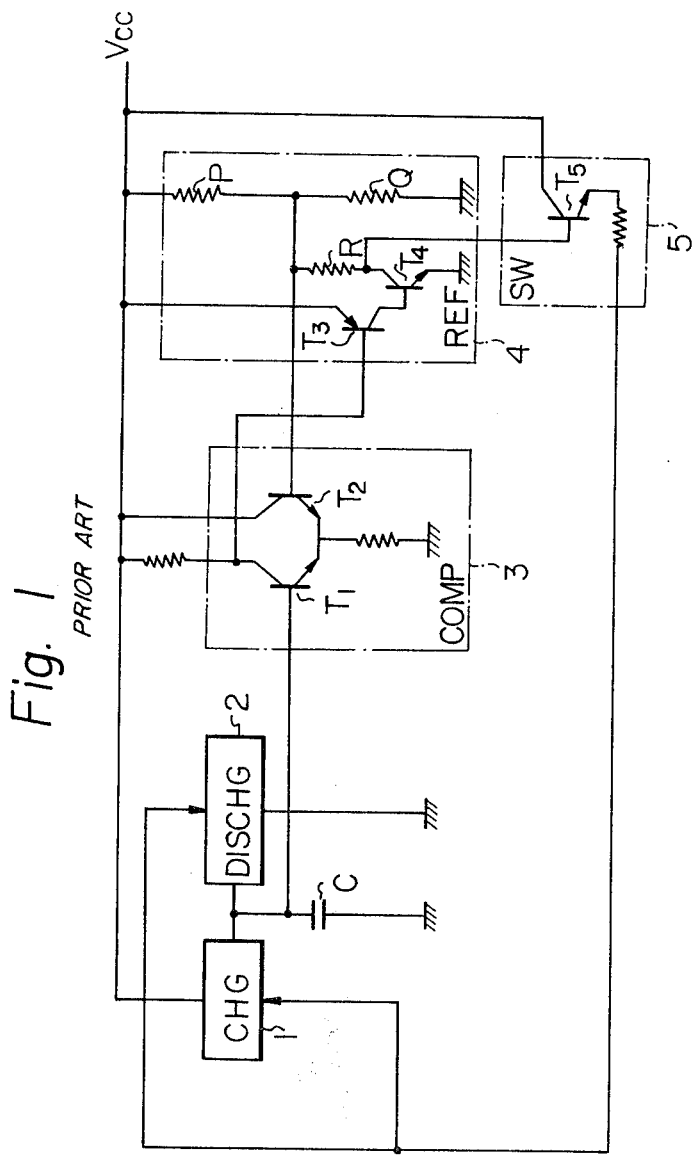
FIG. 1 is a brief block diagram of a prior pulse generator.
Figure 2:
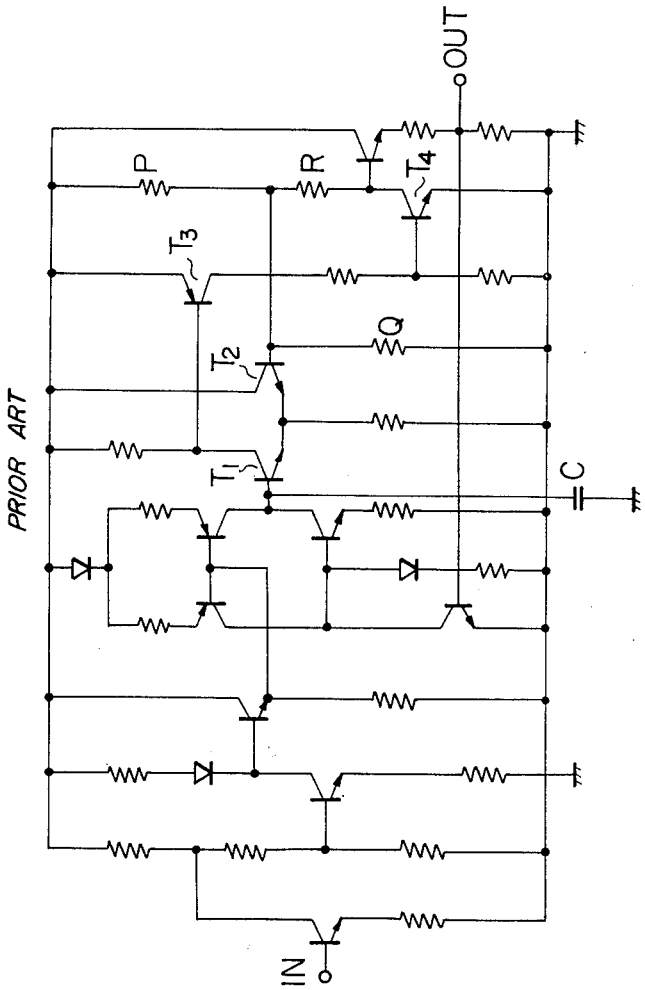
FIG. 2 is a detailed circuit-diagram of the prior pulse generator in FIG. 1.

First, a prior pulse generator will be briefly explained, with reference to FIG. 1 and FIG. 2, for the sake of easy understanding of the present invention. FIG. 1 is block diagram of a prior pulse generator and FIG. 2 is an embodiment of the actual circuit according to the block diagram of FIG. 1. FIG. 2 is the circuit of the integrated circuit $\mu$PC570C manufactured by Nippon Electric Co. In FIG. 1, a capacitor C is charged and discharged by a charge circuit 1 and a discharge circuit 2 respectively, which are controlled by a switching circuit 5. A reference circuit 4 provides a reference voltage to the base of a transistor $T_2$ of a comparator 3. The comparator 3 compares the voltage across the capacitor C with said reference voltage. When the circuit is initiated, the voltage across the capacitor C is zero, the transistor $T_2$ is conducted and a transistor $T_1$ is cut off, the charge circuit 1 is working and the discharge circuit 2 is cut off. Further, since a transistor $T_4$ is cut off, the base of the transistor $T_2$ receives the reference voltage whose value is $Q/P+Q$ Vcc, where P and Q are the values of each of the corresponding resistors, and Vcc is the source voltage.

Since the capacitor C is charged by the charge circuit 1, the voltage across the capacitor C rises gradually, and that voltage is applied to the base of the transistor $T_1$ in the comparator 3. When the voltage across the capacitor C and the base of the transistor $T_1$ reaches and exceeds the reference voltage which is applied to the base of the transistor $T_2$ and is equal to $Q/P+Q$ Vcc, the transistor $T_2$ is cut off and the transistor $T_1$ is conductive. Then, the switching circuit 5 has the charge circuit 1 cut off, and the discharge circuit 2 conduct. Therefore, the capacitor C begins to discharge. At the same time, the transistor $T_4$ is conducted and, therefore, a resistor R is connected in parallel to a resistor Q. Accordingly, in the discharge cycle, the reference voltage applied to the base of the transistor $T_2$ is not $Q/(P+Q) V_{cc}$, but is $$\frac{\frac{RQ}{R+Q}}{P+\frac{RQ}{R+Q}} \cdot V_{cc} = \frac{RQ}{PR+PQ+RQ} \cdot V_{cc},$$

which is lower than $Q/(P+Q) V_{cc}$. Next, the voltage across the capacitor C reaches $RQ/(PR+PQ+RQ) V_{cc}$, the comparator 3 is inverted, the discharge cycle finishes and the charge cycle begins again. The oscillating frequency of the circuit of FIG. 1 depends on the capacitance of the capacitor C, the characteristics of the charge circuit 1 and the discharge cricuit 2, and two reference voltages.

FIG. 2 is a circuit diagram of the integrated circuit μPC570C by NEC, and is the actual embodiment of FIG. 1. In FIG. 2, the symbols $T_1$, $T_2$, $T_3$, $T_4$, P Q and R indicate the same elements as the corresponding symbols in FIG. 1. In FIG. 2, an AFC (Automatic Frequency Control) signal in a television set is applied to a terminal IN, and an output pulse signal is obtained at a terminal OUT. In FIG. 1 and FIG. 2, all components except the capacitor C can be inserted into a single IC chip. However, since the operation of many of the components in FIG. 1 and FIG. 2 suffers from the influence of temperature change, the oscillating frequency of the circuit in FIG. 1 and FIG. 2 is not steady.

Figure 3:
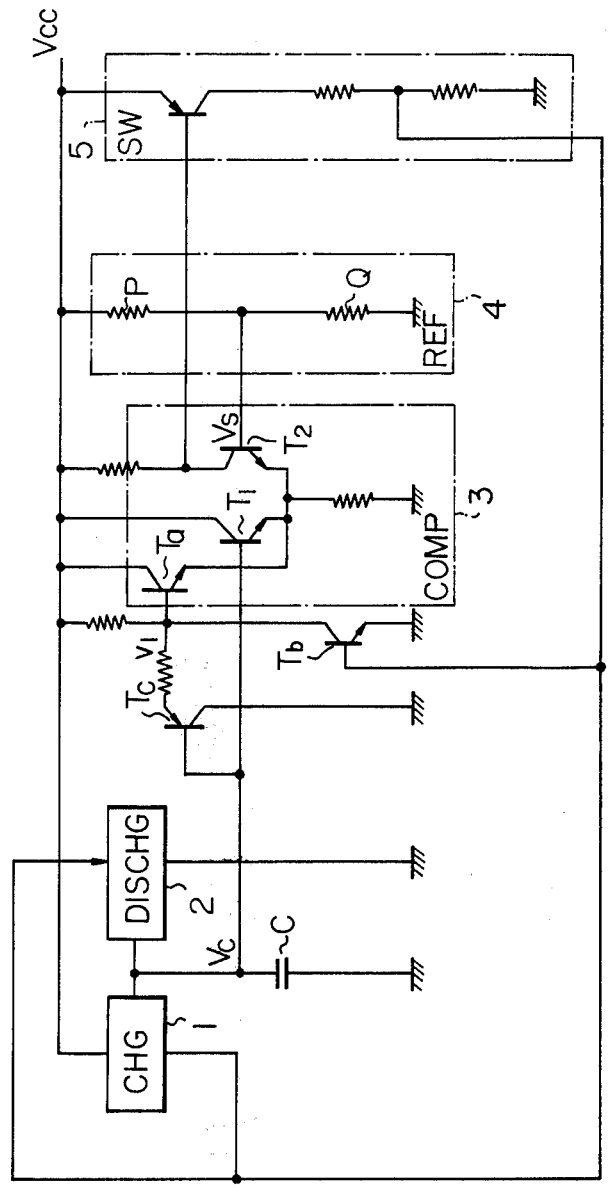
FIG. 3 is a brief block diagram of the pulse generator according to the present invention.

FIG. 3 is a block diagram of an embodiment of the pulse generator according to the present invention. The reference numerals in FIG. 3 which are the same as those in FIG. 1 indicate the same elements as those in FIG. 1. The main differences between the circuits of FIG. 3 and FIG. 1 are that the reference circuit 4 in FIG. 3 has only a pair of resistors P and Q and, thus, the reference voltage $V_s$ to the base of the transistor $T_2$ is always constant, and, that the comparator 3 in FIG. 3 has an additional auxiliary transistor $T_a$ whose emitter is commonly connected to the other transistors $T_1$ and $T_2$. The base of the auxiliary transistor $T_a$ is connected to ground through a transistor $T_b$, the power source through the resistor and the capacitor C through the resistor and a transistor $T_c$.

Figure 6:
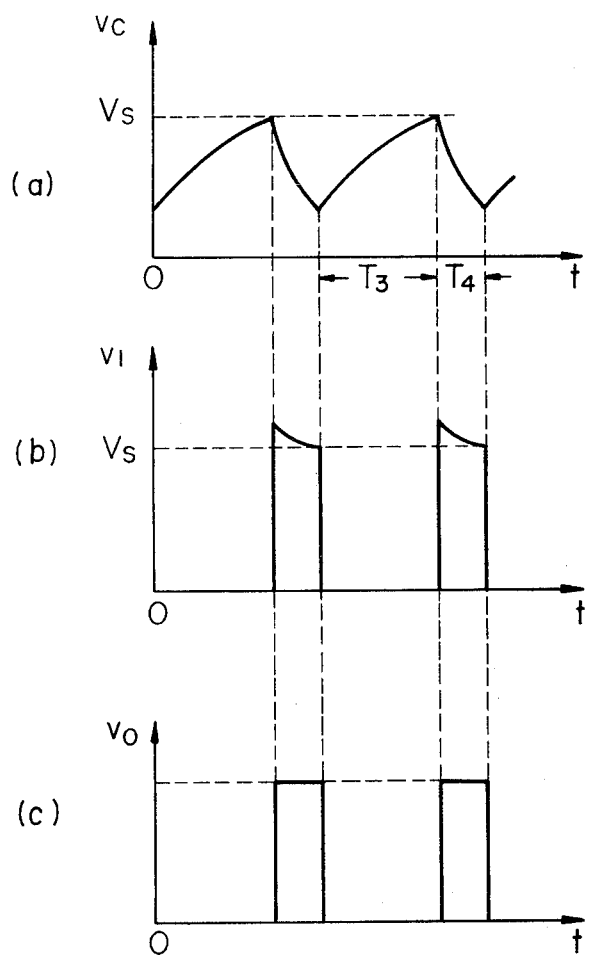
FIG. 6 is operational waveforms of the circuits of FIG. 4.

When the circuit in FIG. 3 is initiated, the transistor $T_2$ is ON, the transistors $T_1$ and $T_a$ are OFF, the voltage $V_c$ across the capacitor C is zero and the charge circuit 1 is working. As the capacitor C is charged by the charge circuit 1, the voltage $V_c$ across the capacitor C is raised. When said voltage $V_c$ reaches the reference voltage $V_s$, the transistor $T_2$ in the comparator 3 is OFF, and the transistor $T_1$ in the comparator 3 is ON. At the same time, since the transistor $T_b$ becomes OFF, the voltage $V_1$ at the base of the auxiliary transistor $T_a$ is raised and the auxiliary transistor $T_a$ becomes ON. The circuit is designed so that at this time the voltage $V_1$ is higher than the reference voltage $V_s$. Further, the change of the output of the comparator 3 stops the operation of the charge circuit 1, and operates the discharge circuit 2. Then, the capacitor C is discharged, the voltage $V_c$ across the capacitor C is decreased and the voltage $V_1$ at the base of the auxiliary transistor $T_a$ is also decreased since the voltage $V_1$ reflects the voltage $V_c$ through the transistor $T_c$. When the voltage $V_1$ becomes equal to or lower than the reference voltage $V_s$, the auxiliary transistor $T_a$ becomes OFF and the transistor $T_2$ is ON and, then, the transistor $T_1$ is OFF. At the same time, due to the conduction of the transistor $T_b$, the voltage $V_1$ becomes zero. Thus, the discharge operation of the capacitor C is stopped and the capacitor C is again charged. As is apparent from the above explanation, the capacitor C is charged until the voltage $V_c$ reaches the reference voltage $V_s$, and the same is discharged until the voltage $V_1$ reaches the reference voltage $V_s$. The waveforms of $V_c$ and $V_1$ are shown in FIG. 6 (a) and FIG. 6 (b), respectively.

Figure 4:
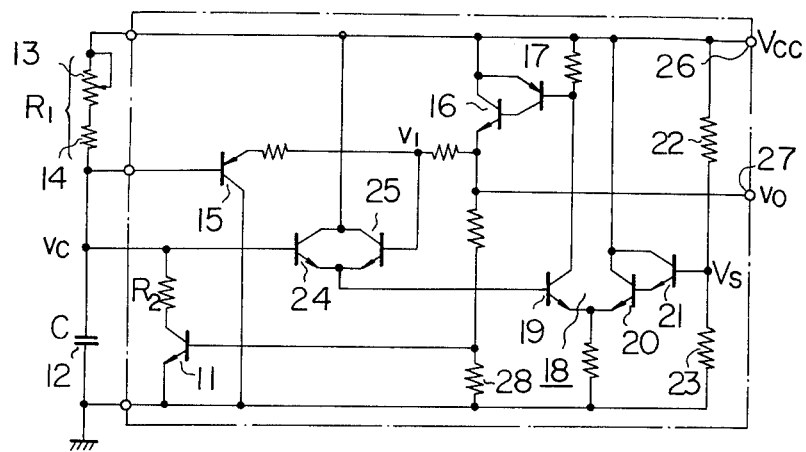
FIG. 4 is a circuit-diagram of a first embodiment of the present invention.

FIG. 4 shows the detailed circuit diagram which embodied FIG. 3. The correspondence of the reference symbols between FIG. 3 and FIG. 4 is shown below.

| FIG. 3 | FIG. 4 |
|---|---|
| Capacitor C | 12 |
| Resistor P | 22 |
| Resistor Q | 23 |
| Transistor $T_1$ | 24 |
| Transistor $T_2$ | 20, 21 |
| Transistor $T_a$ | 25 |
| Transistor $T_b$ | 16, 17 |
| Transistor $T_c$ | 15 |
| Charge circuit 1 | 13, 14 |
| Discharge circuit 2 | 11 |

In the FIG. 4 a capacitor 12 which is shunted by a discharge control transistor 11 is connected in series to a resistance $R_1$ consisting of a variable resistor 13 and a fixed resistor 14. The reference numerals 15, 16 and 17 designate a first switching transistor, a second switching transistor, and a third switching transistor, respectively. A differential unit 18 includes a common emitter transistor pair having transistors 19 and 20 and another transistor 21. The transistors of the differential unit act to compare the input voltage of each of the transistors. Voltage-dividing resistances 22 and 23 are connected between a power source terminal 26 and ground. Correcting transistors 24 and 25 are connected between the capacitor 12 and the differential unit 18. An output voltage $V_o$ is delivered to an output terminal 27. The aforesaid first switching transistor 15 acts as a detecting means of the capacitor voltage $V_c$.

In operation of the pulse generator of FIG. 4, upon turning on a power source switch (not shown), i.e., upon application of a power source voltage $V_{cc}$ to the power source terminal 26, the electric charge at the capacitor 12 is assumed to be zero, i.e., the capacitor voltage $V_c=0$. At this moment, the comparing transistor 19 of the differential unit 18 is kept non-conductive, while the other comparing transistors 20 and 21 of the differential unit 18 are conductive, so that the second switching transistor 16 and the third switching transistor 17 are non-conductive.

After the power source voltage $V_{cc}$ is applied to the terminal 26, the capacitor 12 is charged with a time constant which is determined by the static capacitance C of the capacitor 12 and the charging resistance $R_1$ consisting of the variable resistance 13 and the fixed resistance 14, as shown by the curve a of FIG. 6. When the capacitor voltage $V_c$ reaches a predetermined level $V_s$, which level is established by the voltage-dividing resistances 22 and 23, the operative conditions of the differential unit 18 is reversed, namely, the comparing transistors 20 and 21 become non-conductive and the comparing transistor 19 becomes conductive. Thus, the second switching transistor 16 and the third switching transistor 17 become conductive, for raising the base voltage $V_1$ of the correcting transistor 25. Accordingly, the base voltage $V_1$ becomes larger than the voltage $V_s$, i.e., $V_1 > V_s$, and the comparing transistor 19 becomes more deeply conductive. At this moment, the other correcting transistor 24 is reversely biased and kept nonconductive.

After the capacitor 12 is charged, the collector current of the discharge control transistor 11 begins to flow, and the capacitor voltage $V_c$ is reduced with a time constant which is determined by the static capacitance C of the capacitor 12 and the resistance value $$\frac{1}{\frac{1}{R_1} + \frac{1}{R_2}}$$

in series with the transistor 11, as shown by the curve $a$ of FIG. 6. When the base voltage $V_1$ of the correcting transistor 25 is reduced to the voltage $V_s$, as shown by the curve $b$ of FIG. 6, the condition of the differential unit 18 is reversed, and the second switching transistor 16 and the third switching transistor 17 are turned off. Thus, one charging-discharging cycle of the capacitor 12 is completed.

Waveforms of voltages at different points of the circuit of FIG. 4 are shown in FIG. 6; namely, the curve $a$ represents the capacitor voltage $V_c$, the curve $b$ represents the voltage $V_1$ at the base of the correcting transistor 25, and the curve $c$ represents the output voltage $V_o$. The output voltage $V_o$ has a period equivalent to a sum $T_3 + T_4$, in which the time $T_3$ is proportional to the product $C \cdot R_1$ and the time $T_4$ is proportional to the product $$C \cdot \frac{1}{\frac{1}{R_1} + \frac{1}{R_2}}.$$

The capacitor voltage $V_c$ is a saw tooth wave, as shown by the curve $a$, and the output voltage $V_o$ consists of pulses with a constant magnitude, equivalent to the voltage $V_s$, during the time $T_4$.

With the circuit of FIG. 4, the base voltage of the discharge control transistor 11 is controlled by the second switching transistor 16 and the third switching transistor 17, i.e., by the collector voltage of the comparing transistor 19 of the differential unit 18. Accordingly, even if the capacitor voltage $V_c$ should be abnormally increased to a level close to the power source voltage $V_{cc}$, the discharge control transistor 11 becomes conductive under such conditions, without failure, so as to reduce the capacitor voltage $V_c$.

Furthermore, it should be noted that, with the circuit construction of FIG. 4, the base voltage of the discharge control transistor 11 is controlled by the output from the differential unit 18 through the second switching transistor 16 and the third switching transistor 17, so that the value of a resistance 28 of the figure can be small (e.g., several KΩ). Thus, the effect of the storage time (stored charge time) of the transistor 11 can be reduced.

Figure 5:
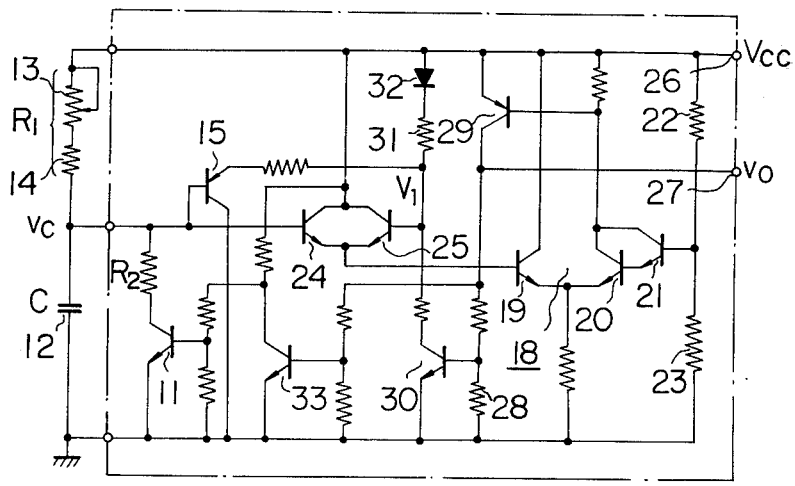
FIG. 5 is a circuit-diagram of a second embodiment of the present invention.

FIG. 5 illustrates a circuit diagram of another pulse generator according to the present invention. The main difference between the circuits of FIG. 4 and FIG. 5 is the presence of a diode 32 in FIG. 5. Said diode 32 compensates the temperature characteristics of the transistor 15.

In this embodiment, the base voltage of the discharge control transistor 11 is controlled by the collector voltage of one comparing transistor 20 of a differential unit 18. As in the case of the preceding embodiment which has been described by referring to FIG. 4, when power source voltage $V_{cc}$ is applied and the capacitor voltage $V_c$ of a capacitor 12 increases and reaches a predetermined level $V_s$, a transistor 29 is turned off. Thus, a transistor 30 is turned off so as to forwardly bias the correcting transistor 25 through a resistor 31.

With the circuit of FIG. 5, when the transistor 29 acting as a reversing transistor is turned on, another transistor 33 is also turned on, for keeping the base voltage of the discharge control transistor 11 at the ground level. In this embodiment, as shown in FIG. 5, the base-emitter voltage $V_{BE}$ of a first switching transistor 15 is temperature compensated by the forward voltage $V_f$ of a diode 32. Thus, the aforesaid temperature compensation is perfectly effected by fulfilling the condition of $V_{BE} = V_f$. This condition is achieved when the circuit of FIG. 5 is made in the form of integrated circuit (IC).

As described in the foregoing disclosure, according to the present invention, a charging-discharging circuit is constructed by using a capacitor, a charging resistance, and a discharging control transistor with a discharging resistance, and the capacitor voltage is compared with a reference voltage $V_s$ by a differential unit which simply acts as a comparator, so as to effect a switching operation in response to the rise and fall of the capacitor voltage for producing an output voltage. Thus, the base bias voltage of the discharge control transistor can be controlled by the aforesaid output voltage, so that the entire circuit can be easily made in the form of an integrated circuit. For instance, the circuit encircled by the dash-dot lines of FIGS. 4 and 5 can be manufactured in the form of integrated circuits.

Furthermore, even if the voltage across the capacitor is abnormally raised to a level close to the power source voltage, the aforesaid discharge control transistor is forwardly biased under such conditions, without failure, so that stable pulse generation can be ensured without necessitating any stabilizing transistors or diodes.

Figure 7:
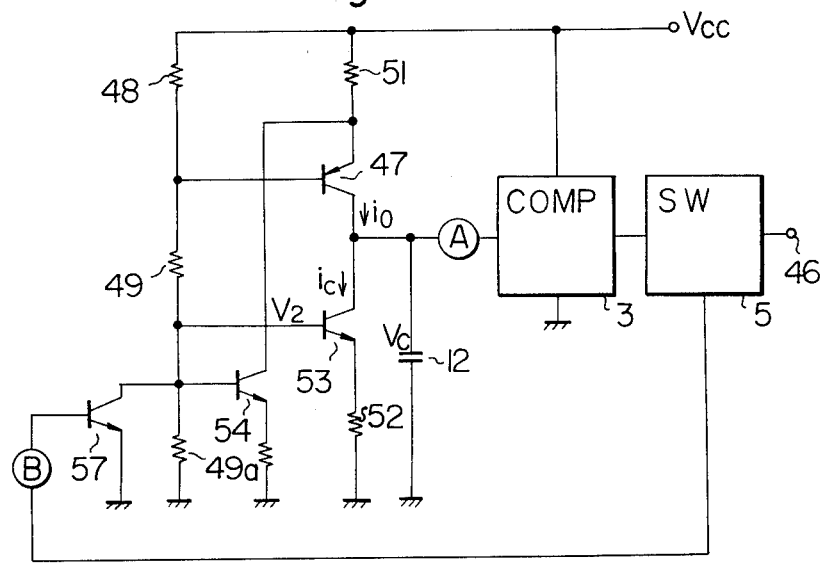
FIG. 7 is a circuit-diagram of a third embodiment of the present invention.
Figure 8:
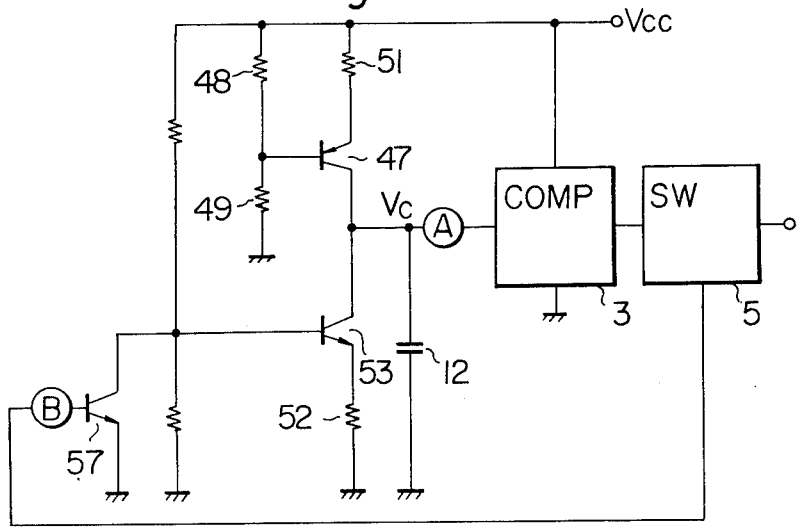
FIG. 8 is a circuit-diagram of a fourth embodiment of the present invention.

FIG. 7 and FIG. 8 concern embodiments which improve the charge circuit 1 and discharge circuit 2 in FIG. 3. Instead of a single resistor $R_1$ as in FIG. 4 and FIG. 5 for the charge circuit, a constant current circuit is provided in FIG. 7 and FIG. 8. A constant current circuit is further provided for the discharge circuit in FIG. 7 and FIG. 8. In FIG. 7 a first transistor 47 is energized by power source voltage $V_{cc}$ through voltage-dividing resistances 48, 49 and 49a, and a first emitter resistor 51 for the transistor 47. The transistor 47 is connected in series to a capacitor 12, by connecting its collector to one terminal of the capacitor 12. The other terminal of the capacitor 12 is grounded. The capacitor 12 is shunted by a second transistor 53 whose emitter is grounded through a second emitter resistance 52. A switching transistor 54 is connected across the first and second transistors 47 and 53. A detector-comparator circuit 3 is connected to the non-grounded terminal A of the capacitor 12, and the output from the circuit 3 is applied to a switching circuit 5. A feedback pulse from the circuit 5 is applied to a terminal B at the base of a third transistor 57.

In the operation of the circuit of FIG. 7, the capacitor 12 is charged through the collector and emitter of the first transistor 47, whose bias voltage is applied through a voltage divider consisting of the voltage-dividing resistances 48, 49 and 49a. As long as the input voltage to the detector-comparator circuit 3 is lower than a reference voltage $V_s$, the output from the circuit 5, i.e., the base voltage of the third transistor 57, is kept at a positive level, so that the switching transistor 54 and the second transistor 53 are both kept non-conductive or under cut-off conditions.

Figure 9:
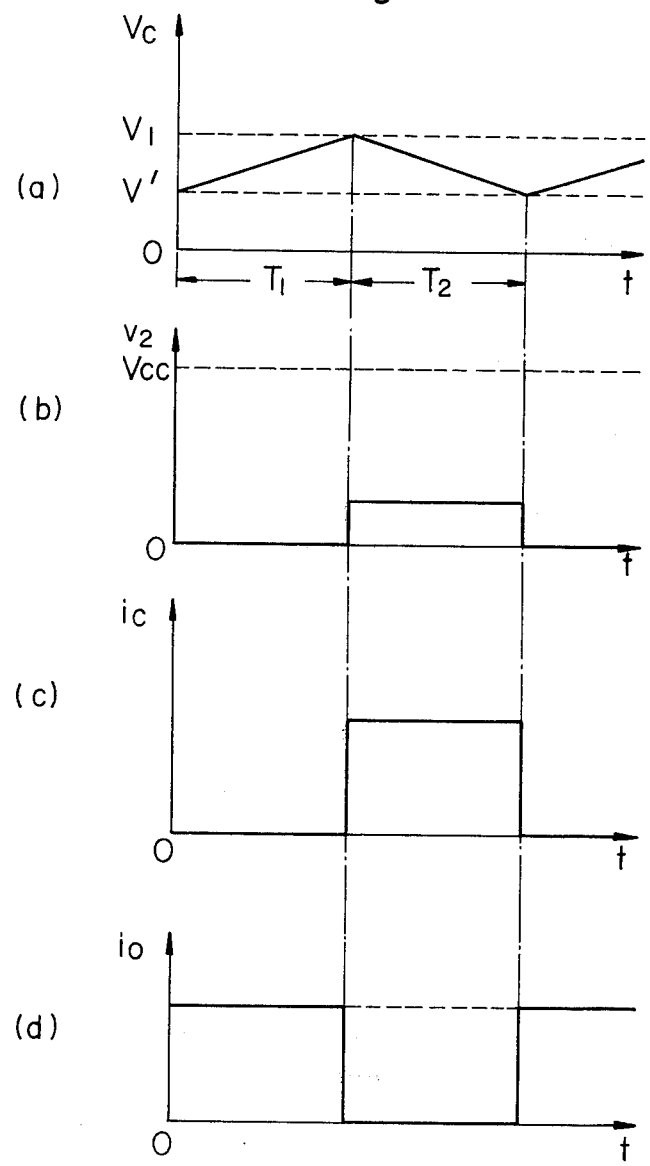
FIG. 9 is operational waveforms of the circuits of FIG. 7 and FIG. 8.

On the other hand, when the voltage $V_c$ across the capacitor 12 increases and reaches the reference voltage $V_s$, as shown by the curve $a$ of FIG. 9, the output from the detector-comparator circuit 3 is instantly reversed, so that a control signal from the circuit 5 is applied to the base of the third transistor 57. Accordingly, the third transistor 57 is turned off, so as to cause the second transistor 53 and the switching transistor 54 to turn on. As a result, the capacitor 12 begins to discharge and the first transistor 47 is cut off. As the capacitor 12 is discharged, the voltage $V_c$ across the capacitor 12 gradually decreases. When the capacitor voltage $V_c$ is reduced below a predetermined value $V_s$, as shown by the curve $a$ of FIG. 9 the output from the circuit 5 is reversed to the positive level, so that the aforesaid charging of the capacitor 12 is resumed. Thus, one charging-discharging cycle of the capacitor 12 is completed and similar cycles are repeated thereafter.

As will be apparent to those skilled in the art, the waveform of the charging current of the capacitor 12 during charging period $T_1$ and the waveform of the collector current $i_c$ of the second transistor 53 during the discharging period $T_2$ will become as shown by the curves $d$ and $c$ of FIG. 9, respectively. The magnitude of the aforesaid periods $T_1$ and $T_2$ can be controlled by regulating the values of the charging current and the discharging current. The voltage $V_2$ at the base of the second transistor 53 varies, as shown by the curve $b$ of FIG. 9.

With the circuit of FIG. 7, the charging current and the discharging current are alternately switched, but the present invention is not restricted to such an arrangement. FIG. 8 illustrates another embodiment, in which a charging current is kept at a constant level, and only during a discharging period does a discharging current which is larger than the charging current flow through a capacitor. The circuit of FIG. 8 uses a first transistor 47 which has its base kept at a constant voltage, so that it allows a direct current of constant magnitude flow therethrough.

Another advantage of the circuit of FIG. 8 is that the number of parts thereof can be reduced, as compared with that of FIG. 7.

As apparent from the foregoing, according to the present invention, the charging and discharging of a capacitor can be controlled while keeping the charging and discharging currents at constant levels, so that it becomes possible to select an arbitrary ratio of $T_1$ to $T_2$.

Figure 10:
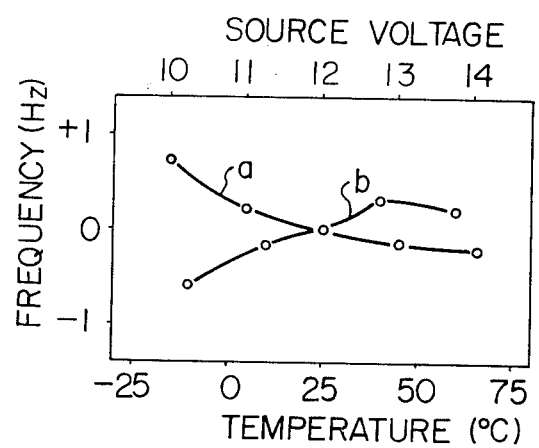
FIG. 10 and FIG. 11 are curves of the experimental result of the pulse generators in FIG. 5 and FIG. 8, respectively.
Figure 11:
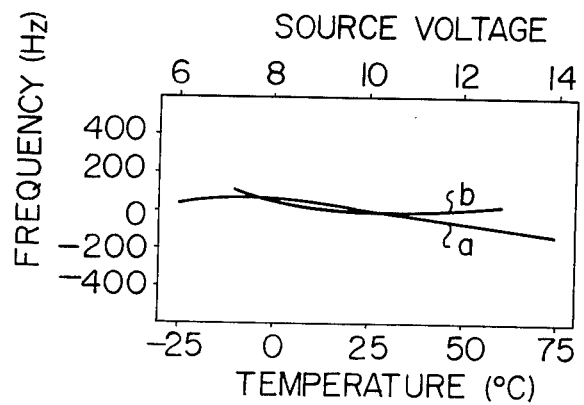

Finally, results of experiments with the present invention are shown in FIG. 10 and FIG. 11. FIG. 10 is the characteristics curve of the circuit in FIG. 5, the oscillating frequency of which is designed to be 60 HZ and;

FIG. 11 is the characteristics curve of the circuit in FIG. 8, the oscillating frequency of which is designed to be 15.734KHZ. In FIG. 10 and FIG. 11, the horizontal axis shows change of temperature and source voltage, the vertical axis shows change of frequency, the curve (a) shows the frequency change when the source voltage is changed, and the curve (b) shows the frequency change when the temperature is changed. It should be noted from FIG. 10 and FIG. 11 that the frequency change is very small although the source voltage and/or the temperature are changed widely.

From the foregoing it will now be apparent that a new and improved pulse generator has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. A pulse generator comprising:
   a. a capacitor, one end of which is grounded;
   b. a charge circuit connected between the other end of said capacitor and a power source;
   c. a discharge circuit connected between said other end of said capacitor and ground;
   d. a comparator having first, second and third transistors, the emitters of these transistors being commonly connected and grounded through a first resistor, the base of the first transistor being connected to said other end of said capacitor, the base of the second transistor being connected to a constant reference voltage source, the base of the third transistor being connected to said other end of said capacitor through a second resistor and an additional transistor, and said base of the third transistor being further connected to the voltage source through a third resistor under the control of a switching transistor; and
   e. a switching circuit coupled to an output of said comparator for switching said charge circuit, said discharge circuit and said switching transistor according to the output of said comparator.

2. A pulse generator according to claim 1, wherein said charge circuit is a resistor connected between the power source and said other end of said capacitor, and said discharge circuit is a series circuit of a resistor and a switching transistor connected between said other end of the capacitor and ground.

3. A pulse generator according to claim 1, wherein said constant reference voltage source comprises a series circuit having a pair of resistors connected between the power source and ground and wherein the base of said second transistor is connected to the common point of said pair of resistors.

4. A pulse generator according to claim 1, wherein said charge circuit is a constant current circuit.

5. A pulse generator according to claim 1, wherein said discharge circuit is a constant current circuit.

* * * * *